United States Patent [19]
Cozart et al.

[11] Patent Number: 5,761,700
[45] Date of Patent: Jun. 2, 1998

[54] ROM MAPPING AND INVERSION APPARATUS AND METHOD

[75] Inventors: Steven E. Cozart; Luis A. Bonet, both of Austin, Tex.

[73] Assignee: Motorola Inc., Schaumburg, Ill.

[21] Appl. No.: 363,843

[22] Filed: Dec. 27, 1994

[51] Int. Cl.[6] ................................................ G06F 12/02
[52] U.S. Cl. .................. 711/102; 711/1; 711/2; 711/5; 711/101; 711/103
[58] Field of Search ............................... 365/210, 175, 365/104; 395/427, 428, 412; 711/1, 2, 5, 101, 102, 103

[56] References Cited

U.S. PATENT DOCUMENTS

| | | | |
|---|---|---|---|
| 4,240,151 | 12/1980 | Kawagoe | 365/104 |
| 4,661,927 | 4/1987 | Graebel | 365/175 |
| 4,805,143 | 2/1989 | Matsumoto et al. | 365/104 |
| 5,226,014 | 7/1993 | McManus | 365/210 |

*Primary Examiner*—Eddie P. Chan
*Assistant Examiner*—Than V. Nguyen

[57] ABSTRACT

Read Only Memory (ROM) (10) data may be selectively inverted to decrease energy dissipation. Within the ROM (10), a plurality of memory cells (16) are connected to bit-line (18) and word-line (20) and store data, which determines the loading for a particular line. Line loading may be manipulated by accessing initial mapping information (23) of the ROM (10) and calculating the line loading on each line (18 or 20) and whenever a line's load exceeds a threshold, data stored in the memory cells (16) on the particular line (18 or 20) are inverted. Having done this, new mapping information (23) is produced and used to retrieve data from the ROM (10).

10 Claims, 4 Drawing Sheets

ROM MAPPING AND INVERSION APPARATUS AND METHOD

TECHNICAL FIELD OF THE INVENTION

The present invention relates generally to integrated circuits and more specifically to an apparatus and method for reducing Read Only Memory power dissipation.

BACKGROUND OF THE INVENTION

Integrated circuits ("ICs") are widely used in many applications. A common component used in many ICs is called a Read Only Memory ("ROM"). A ROM is a device that provides non-volatile storage of data that is used by other components on the IC or by components electrically connected to the IC. Typically, the data stored in the ROM is used at start-up of the system to boot-strap one or more components on the IC to a functional state. Because the same data is used during every start-up, the data is generally hard-wired into the ROM when the ROM is manufactured. Therefore, the data contained in the ROM is built into the mask sets used to manufacture the ROM.

A typical ROM is configured as an N by M array of memory cells, each memory cell being selectively accessible by a processor or another chip. The physical organization of the ROM is generally viewed as a row and column array wherein N columns and M rows comprise the array. The N columns of the array are usually called "bit-lines" while the M rows of the array are usually called "word-lines". At each memory cell, either a plug or a hole may exist. A plug is typically a field effect transistor (FET) having its drain connected to a bit-line, its gate connected to a word-line, and its source connected to a reference ground. When a memory cell containing a plug is accessed (the word line is enabled), the FET is active which pulls the associated bit line to ground to represent a logic "0". A hole is simply an empty memory cell in the array. When a memory cell with a hole is accessed, the bit line is pulled to VDD by the sensing amplifier thereby representing a logic "1". Each bit-line also includes an in-line FET, enabled by one of N column decode lines, that connects the bit-line to a sense amp upon an access of a memory cell on the bit-line.

While the memory contained in the ROM may be accessed in various manners, as one skilled in the art will readily appreciate, the simplest access is a one bit access of a single memory cell. In the access of location (X,Y), for example, the column-decode line associated with bit-line X turns on the FET associated with bit-line X to thereby couple a sense amp to bit-line X. The sense amp then pre-charges bit-line X to a pre-charge voltage level, preferably at a ground potential. After bit-line X is pre-charged, word-line Y is activated and the sense amp tries to drive the voltage on bit-line X high. If the memory cell at location (X,Y) contains a plug, word-line Y turns the FET on, the FET shunts all charge current to ground, and the voltage on bit-line X remains low. If, however, the memory cell at location (X,Y) contains a hole, the sense amp drives the voltage on bit-line X high. Typically, an inverter coupled to the sense amp inverts the bit-line signal. Therefore, if the memory cell at location (X,Y) contains a plug, a logical 1 will be read for that location. Conversely, if the memory cell at location (X,Y) contains a hole, a logical 0 will be read for the location.

A drawback of ROM devices relates to energy dissipation. Each access of a memory cell requires that a corresponding bit-line be pre-charged to a pre-charge level, typically at a ground level. Because of the inherent capacitance of the bit-line and of inherent capacitance between the drains and sources of the turned-off FETs coupled to the bit-line, large amounts of current may be required to pre-charge the bit lines. Typically, three times as much current is required to pre-charge a plug as is required to pre-charge a hole. Thus, bit-lines having many plugs connected to them require proportionally more pre-charge current. In operation, every time a memory cell containing a plug is accessed, the plug shunts current generated from the sense amp to ground. In low power dissipation devices, such as those running on batteries, any current shunt to ground causes the device to dissipate energy. Thus, minimizing shunt current continues to be a desirable goal.

Therefore, techniques have been developed to reduce the amount of current that is shunted to ground through the plugs. One such technique has been to pre-charge the bit-lines at lower voltage levels. While reducing energy dissipation, the lower pre-charge level often was not above the noise level on the bit-line and resulted in lost data during a ROM access. Another technique involved comparing the bit-line output to an external reference level with a comparator. In this fashion, a lower pre-charge level could be used and some of the noise problems were eliminated. The use of differential elements, however, added cost and complexity to the ROM and was undesirable.

Therefore, a need exists for a technique and device that reduces energy dissipation of Read Only Memory devices and does not significantly increase the cost or complexity of the ROM.

DETAILED DESCRIPTION OF THE DRAWINGS

Generally, the present invention provides an apparatus and method for optimally mapping a Read Only Memory (ROM) so as to minimize power dissipation of the ROM. This may be accomplished by selectively inverting data stored in particular lines within the ROM, wherein these particular lines are storing a substantial percentage of logic "0" data, i.e., the memory cells include plugs. By inverting these particular lines, the plugs of the memory cells can be replaced with holes. When an inversion occurs, mapping information of the ROM must be updated to insure that data will be accurately retrieved from the ROM. In this fashion, the present invention reduces the power dissipation of a ROM while only marginally increasing the complexity of the ROM.

Figure 1:
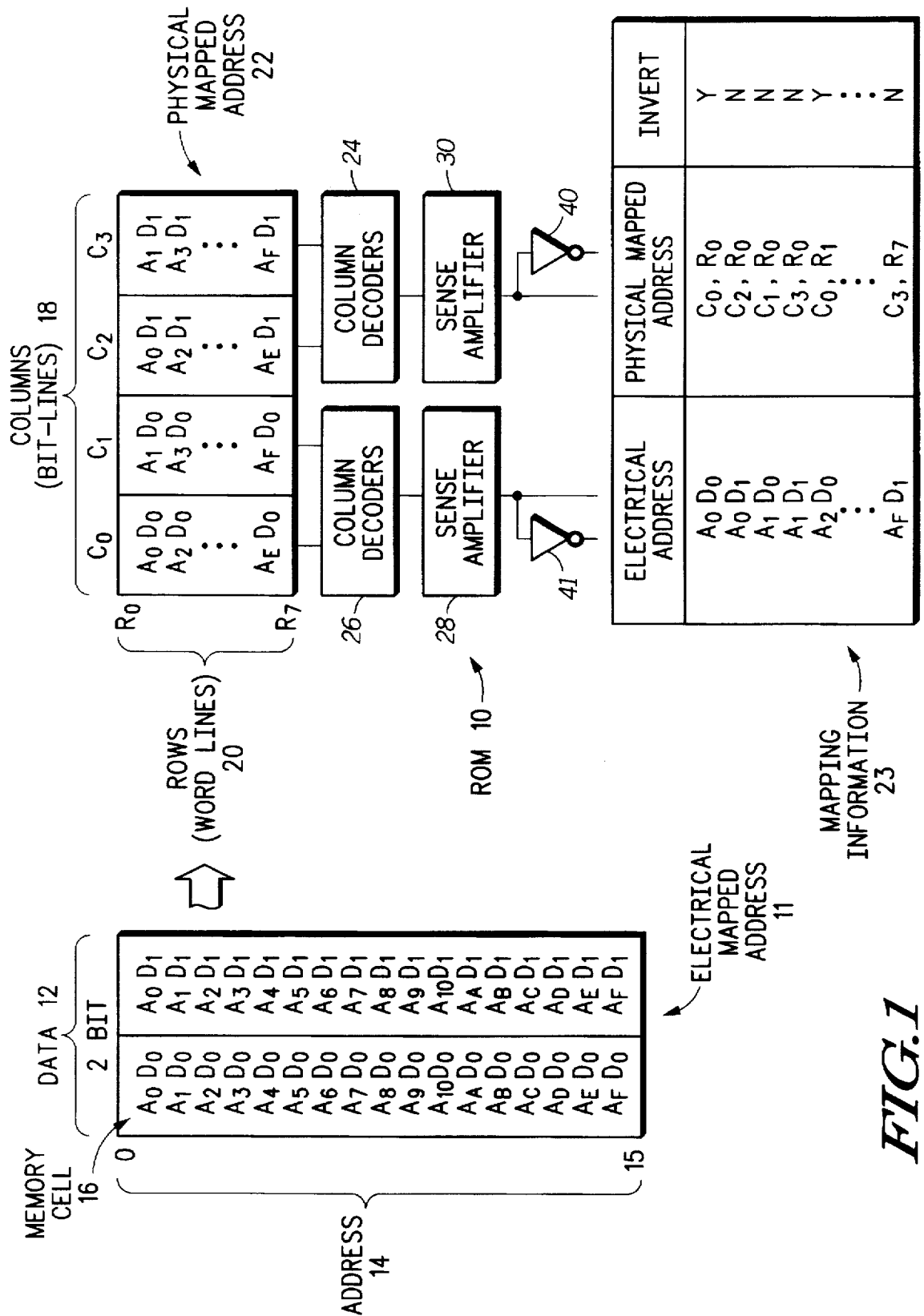
FIG. 1 illustrates a schematic block diagram of a ROM mapping technique in accordance with the present invention.

FIG. 1 illustrates a schematic block diagram of a ROM 10 that may be modified in accordance with the present invention. The ROM 10 comprises a plurality of column decoders 24 and 26, a plurality of memory cells 16 arranged into columns 18 and rows 20, at least one sense amplifier 28 and 30, and at least one inverter 40 and 41. Each of the column decoders 24 and 26 is associated with at least one column 18 of memory cells 16. Each sense amplifier 28 and 30 operably couples to the output of a column decoder 26 and 24 respectively. A first inverter 41 operably couples to the output of the first sense amplifier 28 while a second inverter 40 operably couples to the output of the second sense amplifier 30.

In accordance with the present invention, bits of data stored within a column 18 of the memory cells 16 are selectively inverted to reduce energy dissipation in the ROM by reducing the number of plugs in the column. Mapping information 23 relating electrical mapped addresses 11 of data to physical mapped addresses 22 of data also indicates that data contained within specific columns 18 of memory cells 16 are stored in an inverted fashion and indicates that the bits of data retrieved from the inverted memory cells 16 are to be inverted upon a read. Thus the apparatus of the present invention lowers the energy dissipation of the ROM 10 while maintaining the integrity of the data in the memory cells 16. As one skilled in the art will readily appreciate, the teachings of the present invention may be used to invert data in a variety of manners. Thus, the present invention does not limit an inversion of data to a specific row 20 or column but contemplates the technique of selective inversion and re-inversion of data upon a read so as to minimize the power dissipation of the ROM 10.

In operation, initial mapping information must be obtained for the ROM 10 before any inversion occurs. With reference to FIG. 1, the mapping information 23 relates electrical mapped addresses 11 of data stored in the ROM 10 to physical mapped addresses 22 of the data stored in the ROM 10. The ROM 10 is logically organized, via its electrical mapped addresses, in a (16 by 2) format such that there are 16 address rows 14 and two data columns 12. One bit of data is stored in each memory cell 16 in the ROM 10. Therefore, the memory 10 illustrated in FIG. 1 may store 32 bits of data, one bit of data contained in each of the 32 unique memory cells 16. Each memory cell 16 of the ROM 10 is referenced by a unique electrical address of $(A_i, D_j)$. In this reference, i references the address 14 of the memory cell 16 and j references the data location 12 of the memory cell 16.

A physical mapped address 22 of the memory cells 16 identifies the physical location of a memory cell 16. The physical mapped address 22 associates a memory cell 16 having a physical mapped address 22 $(C_k, R_l)$ with a column (bit-line) 18 and a row (word-line) 20. Thus, k represents the bit-line 18 of the memory cell 16 and l represents the word-line 20 of the memory cell 16. By selectively enabling bit-line k and row-line l, element $(C_k, R_l)$ of the ROM 10 is accessed. The physical mapped address 22 of the ROM 10 of FIG. 1 comprises an 8 by 4 array wherein 8 word-lines 20 and 4 bit-lines 18 address each of the 32 memory cells 16. In a typical application, the physical construction of the ROM 10 is dictated by external constraints such as footprint size and line lengths and therefore the physical ROM 10 construction does not coincide with the electrical organization of the memory cells 16.

Mapping information 23, as shown in the table of FIG. 1, relates the electrical mapped addresses 11 of the ROM 10 to its physical mapped addresses 22. In the first column of the mapping information 23, the electrical address of each memory cell 16 is listed. In the second column of the mapping information 23, physical mapped addresses 22 corresponding to the electrical mapped addresses 11 of column 1 are listed. Thus, by creating the mapping information 23 in the table, initial mapping information for the Read Only Memory device is obtained. The third column in the table of the mapping information 23, labeled "INVERT", is not generated for a standard ROM map but is used in the present invention to account for an inversion of stored data.

During a ROM 10 access, data contained within a specific memory cell 16 is sought. While a specific electrical mapped address 11 of a memory cell 16 is required by the component accessing the ROM 10, a physical mapped address 22 for the memory cell 16 is not known. Thus, mapping information 23 is accessed to find the physical mapped address 22 of the memory cell 16. The physical mapped address 22 locates the specific memory cell 16 as being associated with a particular bit-line 18 and a particular word-line 20. Once determined, a column decoder 24 activates the particular bit-line 18 associated with the specific memory cell 16. A sense amplifier 28 then pre-charges the bit-line 18 to a pre-charge level. As is shown, each column decoder 24 and 26 is associated with two bit-lines 18 and a sense amp 28 or 30 is associated with each column decoder. After the specific bit-line 18 is pre-charged, the particular word-line 20 is enabled and the output of the sense amplifier 28 is read to provide the desired data.

Figure 2:
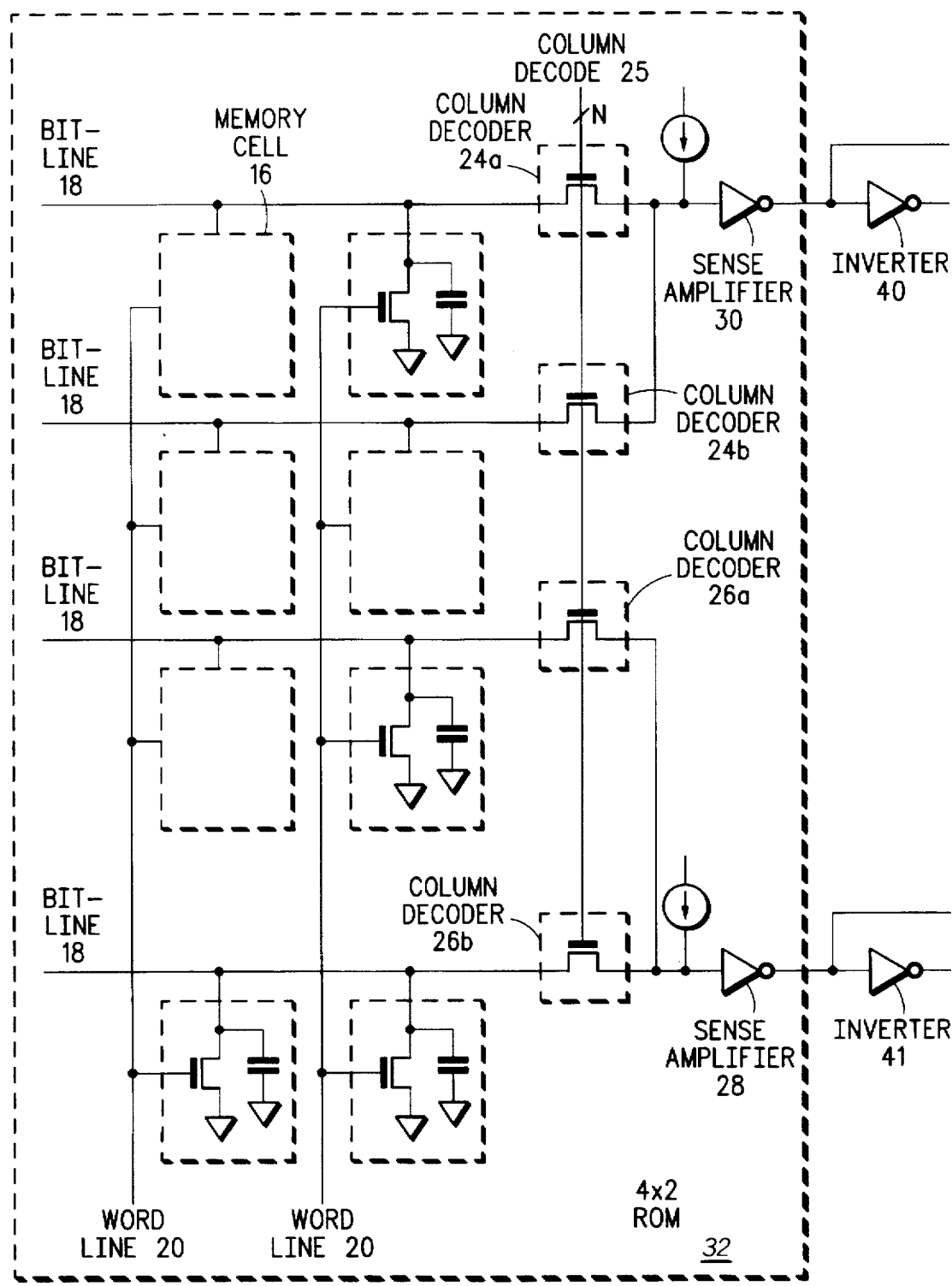
FIG. 2 illustrates a schematic block diagram of a first embodiment of a ROM mapping and inversion apparatus in accordance with the present invention.

The present invention includes determining line loading of a line based on the mapping information 23. FIG. 2 illustrates a schematic block diagram of a 4×2 ROM 32. As shown, a column decode bus 25, having a width N, provides both the first 24 and second 26 column decoders. The first column decoder 24 comprises a first column decoder element 24a and a second column decoder element 24b while the second column decoder 26 comprises a third column decoder element 26a and a fourth column decoder element 26b. As one skilled in the art will readily appreciate, the memory cells 16 associated with the first column decoder element 24a include a plug and a hole. Thus, assuming that the step of determining line loading is based upon a number of plugs on the line and a number of memory cells 16 on the line, the line loading of the bit-lines 18 associated with the first column decoder element 24a is 50%. Making the same assumptions, line loading of the bit-lines 18 associated with the second column decoder element 24b, the third column decoder element 26a, and the fourth column decoder element 26b is 0%, 50%, and 100% respectively.

The present invention uses the mapping information 23 of FIG. 1 directly to determine the line loading of each line 18 or 20 of the ROM 10. Data contained in the electrical mapped addresses 11 is known. The mapping information 23 relates the physical mapped addressees 22 of the ROM 10 to the electrical mapped addresses 11 of the ROM 10. Thus, the contents of each memory cell 16 on each row 20 and column 18 of the ROM 10 may be determined. Therefore, the line loading on each column 18 or row 20 of the ROM 10 may easily be determined from the mapping information 23.

As one skilled in the art will readily appreciate, patterns of data in the mapping information 23 may be discerned by visual inspection or by computer analysis. One producing a physical mapped address 22 of a ROM 10 may notice that almost all memory cells 16 of column 2, for example, are plugs. Thus, in order to conserve energy, one could invert all data contained in that column 18. While the present invention describes inverting data associated with each column 18 of the ROM 10, data may be systematically inverted in differing manners to optimize the inversion process.

In the present invention, when the line loading of a particular bit-line 18 exceeds a line loading threshold, data associated with the particular bit-line 18 is inverted to produce inverted data. Referring to FIG. 2, and selecting a line loading threshold of 55%, data in the memory cells 16 associated with the fourth column decode 26b will be inverted. Referring to the ROM 10 shown in FIG. 1, and assuming that only the line loading of bit-line $C_0$ exceeds the line-loading threshold, all data associated with bit-line $C_0$ of ROM 10 is inverted. Thus, each particular bit-line 18 of the ROM 10 is systematically studied to determine whether inversion of data on the bit-line 18 would result in enough energy savings to justify the expense. If such be the case, the data is inverted. Note that the 55% threshold was chosen as a general threshold and may be adjusted up or down depending on the frequency of access of a particular line. For example, if a line that has 60% plugs, but is rarely accessed, little energy will be conserved from inverting this row, thus the threshold for this row could be above 60%.

When an inversion occurs, new mapping information 23 is determined so that the inversion is transparent to components accessing the ROM 10. Referring to FIG. 1, all data associated with column $C_0$ of the ROM 10 is inverted. Thus, the third column of the mapping information 23 table is altered accordingly to indicate that the data on that bit-line 18 has been inverted. The new mapping information 23 then indicates whether data contained in particular physical mapped addresses 22 has been inverted as well as relating the electrical mapped addresses 11 of the memory cells 16 to the physical mapped addresses 22.

The present invention also contemplates accessing a ROM 10 containing data that has been inverted. Initially, mapping information 23 is obtained and then accessed so as to locate the physical mapped address 22 of the desired data and to determine whether the data has been inverted. The ROM 10 then receives an address command for a memory cell 16 affiliated with the inverted line. Once the address command has been received, the data is inverted if the mapping information 23 indicates that the data in the memory cell 16 was stored in an inverted manner. Preferably, a map decoder, which includes at least one of the inverters 40, 41, and accesses the mapping information 23, determines whether the data in the memory cell 16 has been inverted and inverts the data output from the sense amplifier 28 or 30 accordingly.

As one skilled in the art will readily appreciate, line-loading of each word-line 20 could also be determined. Data stored on the word-line 20 having a line loading that exceeds a line loading threshold could then be inverted and the mapping information 23 could be updated accordingly. Further, the line loading threshold could be determined in manners different than those previously discussed. For example, line loading could be determined based upon the frequency of access on each bit-line. Thus, if a particular word-line 20 were accessed much more frequently than any single bit-line 18 and the word-line 20 contained many plugs, it could be more efficient to invert data on the word-lines than on the bit-lines 18. Thus, the apparatus and method of the present invention may be applied in any manner that would reduce power dissipation of the ROM 10 or 32.

Figure 3:
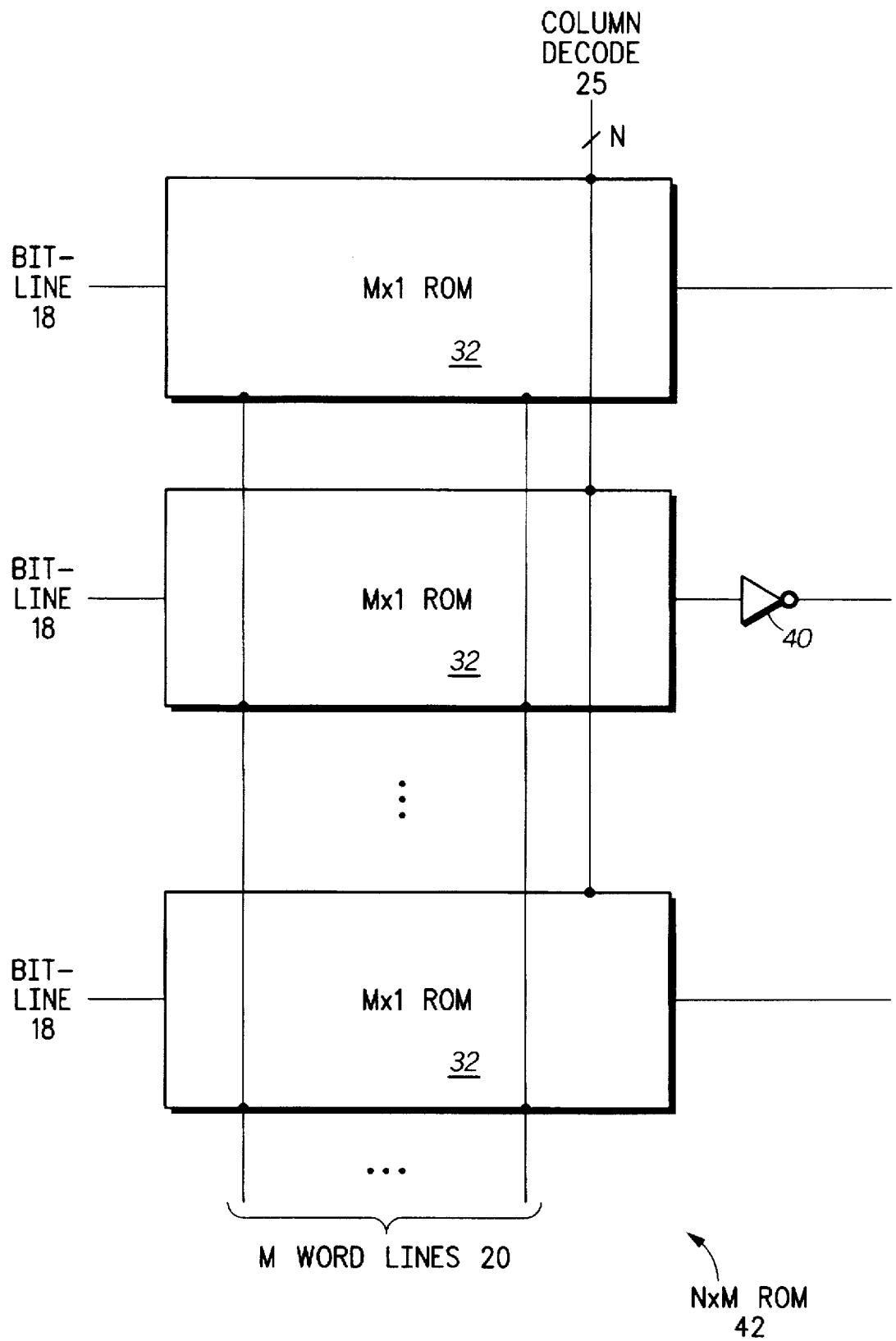
FIG. 3 illustrates a schematic block diagram of a second embodiment of a ROM mapping and inversion apparatus in accordance with the present invention.

FIG. 3 illustrates a schematic block diagram of a second embodiment of a ROM mapping and inversion apparatus of the present invention. The embodiment includes an N×M ROM 42 comprising N ROM elements 44 each including an M×1 array of memory cells (not shown). Each ROM element 44 includes a bit-line 18 that is individually enabled by one of the lines of the N width column decode bus 25. M word lines enable the M memory cells of each ROM element 44. As is shown, all of the data of the ROM element 44 associated with inverter 40 has been inverted to compensate for the inversion of data within the ROM element 44. Thus, in the second embodiment, inversion of the output data of the ROM element 44 has been hardwired so that the mapping information 23 for the ROM 42 need not include inversion information. For simplicity, and if appropriate for the situation, the inversion of data could be done all on the component level so that the mapping information 23 need not consider the inversion process.

Figure 4:
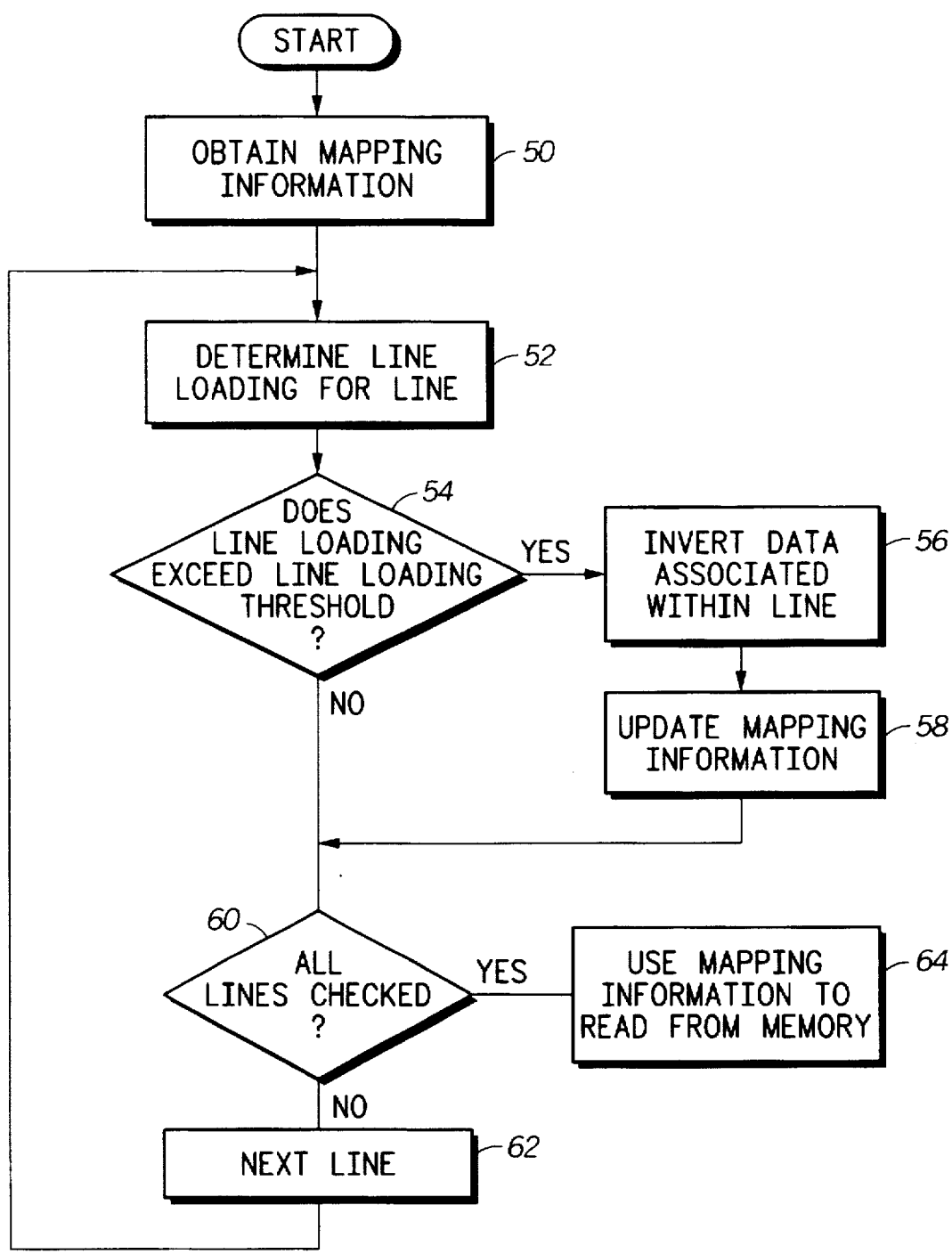
FIG. 4 illustrates a logic diagram of a preferred embodiment of the ROM mapping and inversion method in accordance with the present invention.

FIG. 4 illustrates a logic diagram of the preferred embodiment of the ROM mapping and inversion method of the present invention as described above. The method commences at step 50 wherein initial mapping information of a ROM 10 device is obtained. At step 52, line loading for a particular line is determined. The line could be a bit-line 18 or a word-line 20. At decision block 54 it is determined whether the line loading exceeds a line loading threshold. If it does, at step 56, data associated with the line is inverted and then at step 58 the mapping information is updated. From step 58, the method proceeds to decision block 60. If at decision block 54 the line loading does not exceed the line loading threshold, the method proceeds to decision block 60. If, at decision block 60, all lines have been checked the method proceeds to step 64 where the updated mapping information is used to read from the ROM 10. If, at decision block 60, all lines have not been checked, at step 62, a next line is selected and the method returns to step 52.

The present invention provides an apparatus and method for optimally mapping a Read Only Memory (ROM) so as to minimize power dissipation of the ROM. As discussed, this is accomplished by selectively inverting data stored in particular lines within the ROM, wherein these particular lines are storing a substantial percentage of logic "0" data, i.e., the memory cells include plugs. By inverting these particular lines, the plugs of the memory cells can be replaced with holes. When an inversion occurs, mapping information of the ROM must be updated to insure that data will be accurately retrieved from the ROM. In this fashion, the present invention reduces the power dissipation of a ROM while only marginally increasing the complexity of the ROM.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. A method for mapping a read only memory (ROM), the method comprising the steps of:
   (a) obtaining initial mapping information for the ROM;
   (b) determining a line loading of a bit line based on the initial mapping information, wherein the line loading indicates a proportion of memory cells coupled to the bit line which are programmed using a plug;
   (c) when the line loading exceeds a line loading threshold, storing within each of said plurality of memory cells associated with the bit line a value opposite to that indicated by the initial mapping information; and
   (d) inverting a logic level conducted on the bit line during an access.

2. The method of claim 1 further comprising the step of calculating the line loading threshold based upon the number of plugs on the line equaling 55% of a number of memory cells on the line.

3. The method of claim 1 further comprising the step of determining a line loading for each of a plurality of bit lines based on the initial mapping information.

4. A read only memory (ROM) comprising:

a plurality of word lines;

a plurality of bit lines crossing said plurality of word lines;

a plurality of memory cells wherein each memory cell is located at an intersection a word line of said plurality of word lines and a bit line said plurality of bit lines, each memory cell characterized as being in either a first state or a second state;

when in said first state a memory cell includes a plug, wherein said plug couples a corresponding bit line to a reference voltage terminal when a corresponding word line is selected;

when in said second state said memory cell includes a hole, wherein said hole isolates said corresponding bit line from said reference voltage terminal;

a plurality of column select transistors each having a first current electrode, a second current electrode coupled to an input of a sense amplifier, and a control electrode for receiving a corresponding column select signal;

wherein at least one bit line of said plurality of bit lines is connected through an inverter to said first current electrode of a corresponding column select transistor; and wherein others of said plurality of bit lines are connected to said first current electrode of a corresponding column select transistor, whereby a majority of memory cells coupled to said at least one bit line are in said second state, thereby reducing power consumption of the ROM.

5. The ROM of claim 4 wherein said plug comprises a transistor having a control electrode coupled to said corresponding word line, a first current electrode coupled to said corresponding bit line, and a second current electrode coupled to said reference voltage terminal.

6. The ROM of claim 4 further comprising precharge means coupled to the plurality of bit lines, for coupling each of said plurality of bit lines to a second voltage reference terminal during a read cycle.

7. A method for reducing power consumed by a read only memory (ROM), the ROM comprising a plurality of ROM cells located at intersections of a plurality of word lines and a plurality of bit lines, wherein each ROM cell is in either a first logic state or a second logic state, when in said first logic state a ROM cell includes a plug, wherein the plug couples a corresponding bit line to a reference voltage terminal when a corresponding word line is selected, and when in said second logic state said ROM cell includes a hole, wherein the hole isolates said corresponding bit line from said reference voltage terminal, the method comprising the steps of:

defining an initial mapping of information of each of the plurality of ROM cells into either the first logic state or the second logic state;

determining a proportion of ROM cells coupled to a bit line which are in the first logic state;

if said proportion exceeds a predetermined threshold, changing a logic state of all ROM cells coupled to said bit line to an opposite state;

precharging the bit line;

activating a word line thereby to select a ROM cell on the bit line; and inverting a data value on the bit line to provide an inverted data value, so that said inverted data value corresponds to said initial mapping of said ROM cell.

8. A read only memory (ROM) comprising:

a plurality of word lines;

a plurality of bit lines crossing said plurality of word lines;

a plurality of memory cells wherein each memory cell is located at an intersection a word line of said plurality of word lines and a bit line said plurality of bit lines, each memory cell characterized as being in either a first state or a second state;

when in said first state, a memory cell includes a transistor having a control electrode coupled to a corresponding word line, a first current electrode coupled to a corresponding bit line, and a second current electrode coupled to a voltage reference terminal;

when in said second state, said memory cell includes a hole, wherein said hole isolates said corresponding bit line from said voltage reference terminal;

precharge means coupled to the plurality of bit lines, for coupling each of said plurality of bit lines to a second voltage reference terminal during a read cycle; and sense amplifier means coupled to each of the plurality of bit lines for sensing a data value conducted on each bit line during the read cycle, wherein for at least one of said plurality of bit lines said sense amplifier means provides a sense data value in a logic state opposite that of the data value, and for others of said plurality of bit lines said sense amplifier means provides said sense data value at a logic state equal to the data value.

9. The ROM of claim 8 further comprising column decoder means coupled to said sense amplifier means for providing a data output signal in response to an output of the sense amplifier means for at least one bit line.

10. The ROM of claim 8 wherein a proportion of memory cells, coupled to each bit line, that are in said second state is greater than or equal to fifty percent.

* * * * *